(12) United States Patent
Goto

(10) Patent No.: US 8,336,891 B2
(45) Date of Patent: Dec. 25, 2012

(54) ELECTROSTATIC CHUCK

(75) Inventor: Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 952 days.

(21) Appl. No.: 12/400,830

(22) Filed: Mar. 10, 2009

(65) Prior Publication Data

US 2009/0230636 A1  Sep. 17, 2009

Related U.S. Application Data

(60) Provisional application No. 61/035,470, filed on Mar. 11, 2008.

(51) Int. Cl.
  *B23B 31/28* (2006.01)
  *H01L 21/683* (2006.01)

(52) U.S. Cl. .................. 279/128; 118/728; 156/345.53; 361/234

(58) Field of Classification Search .................. 279/128; 118/728; 156/345.53; 361/234; *B23B 31/28; H01L 21/683; G01T 23/00*
  See application file for complete search history.

(56) References Cited

U.S. PATENT DOCUMENTS

| | | | | |
|---|---|---|---|---|
| 5,103,367 A | * | 4/1992 | Horwitz et al. | 361/234 |
| 5,463,525 A | * | 10/1995 | Barnes et al. | 361/234 |
| 5,535,507 A | * | 7/1996 | Barnes et al. | 29/825 |
| 5,539,609 A | * | 7/1996 | Collins et al. | 361/234 |
| 5,644,467 A | * | 7/1997 | Steger et al. | 361/234 |
| 6,151,203 A | * | 11/2000 | Shamouilian et al. | 361/234 |
| 6,346,428 B1 | * | 2/2002 | Athavale et al. | 438/14 |
| RE37,580 E | * | 3/2002 | Barnes et al. | 361/234 |
| 6,471,779 B1 | | 10/2002 | Nishio et al. | |
| 6,847,516 B2 | * | 1/2005 | Kwon et al. | 361/234 |
| 6,853,141 B2 | * | 2/2005 | Hoffman et al. | 315/111.21 |
| 7,336,471 B2 | * | 2/2008 | Suehira et al. | 361/220 |
| 7,821,767 B2 | * | 10/2010 | Fujii | 361/234 |
| 7,952,851 B2 | * | 5/2011 | LaFontaine et al. | 361/234 |
| 7,983,017 B2 | * | 7/2011 | Simpson | 361/234 |
| 2005/0005859 A1 | * | 1/2005 | Koshiishi et al. | 118/728 |
| 2005/0103444 A1 | * | 5/2005 | Brcka | 156/345.48 |
| 2005/0105243 A1 | * | 5/2005 | Lee et al. | 361/234 |
| 2006/0016554 A1 | * | 1/2006 | Ahn | 156/272.2 |
| 2007/0000843 A1 | * | 1/2007 | Kimball et al. | 210/745 |
| 2010/0177454 A1 | * | 7/2010 | Elliot et al. | 361/234 |
| 2010/0321856 A1 | * | 12/2010 | Peitzsch | 361/234 |
| 2011/0024049 A1 | * | 2/2011 | Stevenson et al. | 156/345.53 |

FOREIGN PATENT DOCUMENTS

JP  2000-315680  11/2000

(Continued)

*Primary Examiner* — Eric A Gates

(74) *Attorney, Agent, or Firm* — Burr & Brown

(57) ABSTRACT

An electrostatic chuck includes (a) a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port; (b) an arc prevention member buried in the main counter bore portion and made of an insulating member, wherein a gas path is provided, the gas path is configured to communicate with the gas supply port; and (c) an electrostatic chuck body arranged on the cooling device, defining a work mounting surface on a top surface of the electrostatic chuck body, provided with a pore in communication with the gas supply port via the gas path.

11 Claims, 7 Drawing Sheets

FOREIGN PATENT DOCUMENTS

| | | | | |
|---|---|---|---|---|
| JP | 2006118004 A | * | 5/2006 | |
| JP | 2008078283 A | * | 4/2008 | |
| JP | 2008172255 A | * | 7/2008 | |
| JP | 2009065133 A | * | 3/2009 | |
| JP | 2009105386 A | * | 5/2009 | |
| JP | 2010010214 A | * | 1/2010 | |
| JP | 2010114471 A | * | 5/2010 | |
| JP | 2010123712 A | * | 6/2010 | |
| JP | 2010177671 A | * | 8/2010 | |
| JP | 2011108816 A | * | 6/2011 | |

* cited by examiner

ELECTROSTATIC CHUCK

CROSS-REFERENCE TO RELATED APPLICATION AND INCORPORATION BY REFERENCE

This application claims benefit of priority under 35 USC 119 based on U.S. Patent Application 61/035,470, filed Mar. 11, 2008, and Japanese Patent Application P2009-52670, filed Mar. 5, 2009, the entire contents of which are incorporated by reference herein.

BACKGROUND OF THE INVENTION

1. Field of the Invention

The present invention relates to an electrostatic chucks.

2. Description of the Related Art

An electrostatic chuck is used as a mounting base for fixing (holding) a workpiece in various processes of manufacturing a semiconductor devices. Here, the term "workpiece" mainly corresponds to a wafer or a reticle.

Besides fixing the wafer, the electrostatic chuck can be used for efficiently removing heat created in the process from the wafer so as to maintain the temperature of the wafer substantially constant. In order to increase the cooling effect on the wafer, the electrostatic chuck is arranged on a cooling device. In order to remove heat from the wafer to be adsorbed by the electrostatic chuck, a pore (passage) has been provided in the electrostatic chuck for a back side gas, such as Helium (He), to flow therethough to the back side of the wafer (for example, see Japanese Patent Application Laid-Open (JP-A) No. 2000-315680). Depending on application, there is a requirement to improve the cooling effect on the wafer.

When the wafer is mounted on the electrostatic chuck and is then processed by plasma etching, the etching rate is likely to be different on the wafer surface due to on-uniformity of the plasma. As a means for solving such problem, it has been required to increase the plasma density.

The higher plasma density increases heat flow into the wafer. The cooling efficiency needs to be improved by reducing the thickness of the electrostatic chuck and the distance between the metallic cooling device and the wafer mounting surface. In this case, arcing can be caused near the pores in which the back side gas flows. When the arcing occurs, problems such as deposited particles, wafer damage, and breakage of the electrostatic chuck may occur.

SUMMARY OF THE INVENTION

According to a first aspect of the present invention, an electrostatic chuck includes (a) a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port; (b) an arc prevention member buried in the main counter bore portion and made of an insulating member, wherein a gas path is provided, the gas path is configured to communicate with the gas supply port; and (c) an electrostatic chuck body arranged on the cooling device, defining a work mounting surface on a top surface of the electrostatic chuck body, provided with a pore in communication with the gas supply port via the gas paths.

According to a second aspect of the present invention, an electrostatic chuck includes (a) a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port; (b) an arc prevention member buried in the main counter bore portion, wherein a plurality of grooves are provided in the surface of the arc prevention member defined around a centerline in a cross-sectional view in a gas flow direction of the arc prevention member so as to define gas paths, the gas paths are configured to communicate with the gas supply port when the arc prevention member is inserted into the main counter bore portion; and (c) an electrostatic chuck body arranged on the cooling device, defining a work mounting surface on a top surface of the electrostatic chuck body, provided with pore(s) in communication with the gas supply port via the gas paths.

According to a third aspect of the present invention, an electrostatic chuck includes (a) a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port; (b) an arc prevention member buried in the main counter bore portion, wherein the arc prevention member comprising a cross-shaped sub-counter bore portion formed of two grooves intersecting at a central portion in a radial direction of the arc prevention member on a main plane of the arc prevention member on the electrostatic chuck body side, and having a plurality of planar cutouts, which run straight in a longitudinal direction of each of the grooves of the cross-shaped sub-counter bore portion, on a cylindrical side surface so as to form a gas path when inserted into the main counter bore portion; and (c) an electrostatic chuck body arranged on the cooling device, defining a work mounting surface on a top surface of the electrostatic chuck body, provided with pore(s) in communication with the gas supply port via the gas paths.

DETAILED DESCRIPTION OF THE INVENTION

Figure 1A:
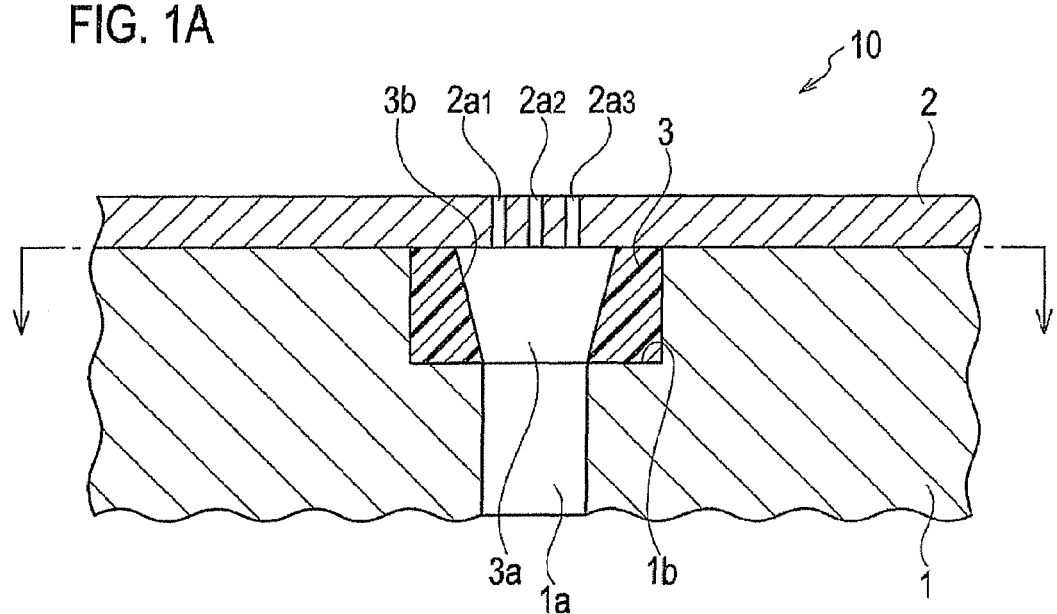
FIG. 1A illustrates a cross section of an electrostatic chuck according to an embodiment.

The present invention will be described below by giving an embodiment. The present invention is not limited to the following embodiment. Parts having the same or similar functions in the drawings are indicated by the same or similar reference numerals and the description is omitted. A wafer is used as an example of a work (workpiece).

The present invention provides an electrostatic chuck which can prevent arcing, which is caused by the use of high density plasma.

(Electrostatic Chuck)

An electrostatic chuck 10 according to an embodiment illustrated in FIG. 1A includes a cooling device 1 serving as an RF electrode, which has a gas supply port 1a penetrating through the cooling device 1, the gas supply port 1a extending from one main surface to the other main surface, for supplying a gas for plasma generation, and a main counter bore portion 1b. The main counter bore portion 1b has a diameter larger than that of the gas supply port 1a and is provided at an opening of the gas supply port 1a. An arc prevention member 3 is inserted into the main counter bore portion 1b and has an insulating member provided with a gas path 3a configured to communicate with the gas supply port 1a. Also included is an electrostatic chuck body 2 arranged on the cooling device 1 and has a work mounting surface provided with a plurality of pores 2a1, 2a2, and 2a3 in communication with the gas supply port 1a via the gas path 3a. The work mounting surface is configured to fix (hold) a wafer thereon. The electrostatic chuck body 2 and the cooling device 1 are joined (connected) by an unillustrated sheet arranged between the electrostatic chuck body 2 and the cooling device 1. The number of pores is not particularly limited to three.

The arc prevention member 3 has a substantially cylindrical shape defining a gas path therein. An inner wall 3b of the arc prevention member 3 is tapered and has an inner diameter extending concentrically from the cooling device 1 toward the electrostatic chuck body 2. To prevent arcing, the diameter of the arc prevention member 3 is preferably two or more times the thickness of the electrostatic chuck body 2. From the viewpoint of increasing the plasma density and the cooling effect on the workpiece, the diameter of the arc prevention member 3 is preferably at most four times the thickness of the electrostatic chuck body 2. The smallest inner diameter of the arc prevention member 3 is equal to or less than the inner diameter of the gas supply port 1a.

From the viewpoint of increasing the cooling effect on the workpiece, the thickness between the workpiece mounting surface and the abutting surface on the cooling device of the electrostatic chuck body 2 is preferably three mm or less, more preferably, 1.5 mm or less. The plurality of pores 2a1, 2a2, and 2a3 provided in the electrostatic chuck body 2 preferably have an inner diameter of 150 μm or less. The material of the electrostatic chuck body 2 is not particularly limited. To provide good heat conduction and excellent corrosion resistance to a reactive gas, aluminum nitride ceramics, a composite material including aluminum nitride, alumina ceramics, a composite material including alumina, and composite ceramics of alumina and aluminum nitride are preferable materials for the chuck body. Silicon carbide, yttrium oxide, or a composite material of these may also be used. The material of an inner electrode is not 1a particularly limited and may be conductive ceramics or a metal. A refractory metal is preferable. Molybdenum, tungsten, and an alloy of molybdenum and tungsten are particularly preferable.

The material of the arc prevention member 3 is not particularly limited if it includes insulation properties. A heat-resistant fluorocarbon resin such as polytetrafluoroethylene (e.g., the registered trademark Teflon) and refractory insulating ceramics such as alumina may be used. As the material of the arc prevention member, it is more preferable to use refractory insulating ceramics, such as alumina or aluminum nitride, which is less likely to change its shape from the viewpoint of long-term use and has a high heat conductivity for cooling.

The cooling device 1 is formed with an interior channel for cooling water, the surface of such channel being covered with an aluminum plate. It is preferable that the largest diameter of the cooling device be approximately equal to that of the electrostatic chuck body 2. The thickness of the cooling device 1 is not particularly limited. When the largest diameter of the cooling device 1 is about 300 mm, the thickness of the cooling device 1 is preferably about 30 to 40 mm. The material of the cooling device 1 is not particularly limited if it has good heat conduction and it is preferable to use aluminum.

Various sheet materials can be used for the interface connection between the chuck body and the cooling device without being particularly limited. For instance, an acrylic resin, a silicone resin, a modified polyimide resin can be used. An adhesive may be used in place of the sheet material. Considering the adhesive flow, a flexible adhesive sheet is preferable.

As compared with an electrostatic chuck 110 illustrated in FIG. 7, the operation and effect of the electrostatic chuck 10 according to the embodiment will be described.

Figure 7:
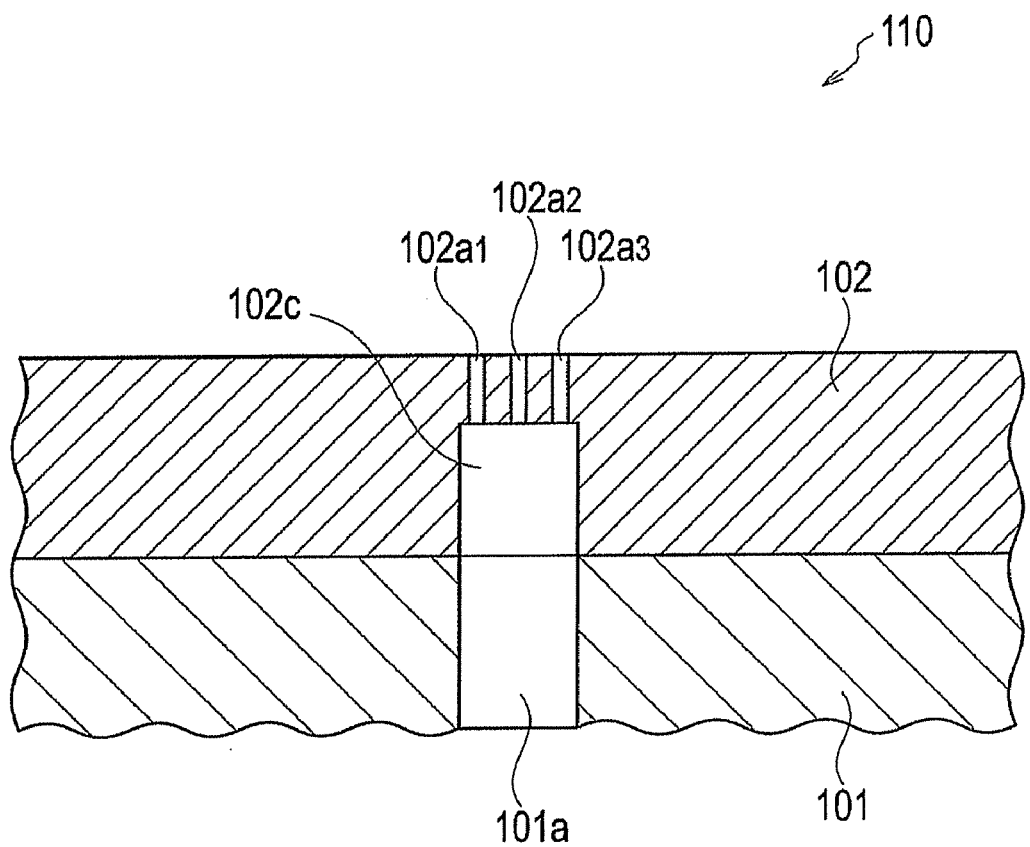
FIG. 7 is a cross-sectional view of a prior art electrostatic chuck.

As illustrated in FIG. 7, when there is a long distance between a top surface of a cooling device 101 and an electrostatic chuck body 102, because the cooling efficiency of the wafer is low, and unless a high voltage is applied, the plasma density generated by the RF electrode cannot be increased, a desired process characteristic cannot be satisfied.

To increase the plasma density and the cooling efficiency of the wafer, the present inventors have contemplated reducing the thickness of the electrostatic chuck body 2, as illustrated in FIG. 1. Although the reason is not certain, when the distance between the cooling device 1 which serves as the RF electrode and the wafer mounting surface is shortened and plasma is generated, a problem arises in that an arc trace which is assumed to be caused by arcing and glow discharge in the opening of the supply port of a back side gas adheres to the workpiece. Arcing can damage the cooling device 1 and create particles or contamination, thereby damaging the back side of the wafer (mounting surface). An arcing prevention method has been desired.

In the electrostatic chuck of FIG. 7, there is a long distance between the cooling device 101 and the electrostatic chuck body 102 and the space of a gas supply port 101a is large. A ceramics piece is arranged in the gas supply port space to prevent creation of an arc. When the distance between the cooling device 1 and the wafer mounting surface is short, as illustrated in FIG. 1A, it is not possible to have enough space to arrange the ceramics piece.

As a result of diligent study by the present inventors, according to the above embodiment, overcoming the problem of the arc trace enables the plasma density generated by the RF electrode and the cooling efficiency of the wafer to be increased.

According to the embodiment, the use of the arc prevention member 3 can prevent arcing in the gas supply port 1a when the distance between the cooling device 1 and the wafer mounting surface defined on electrostatic chuck body is decreased, and can generate plasma having a higher density. It is thus possible to achieve an increased wafer processing speed in the plasma etching process.

(An Electrostatic Chuck Manufacturing Method)

A method for manufacturing the electrostatic chuck 10 when the electrostatic chuck body 2 is made of aluminum nitride will be described.

(a) First, aluminum nitride powder is molded into a predetermined shape to form a molded body. Then, an inner electrode made of molybdenum is arranged on the molded body. The aluminum nitride powder is molded on the inner electrode arranged surface of the molded body, thereby obtaining a disc-like molded body with the inner electrode buried therein. A DC voltage for the electrostatic electrode buried in the electrostatic chuck body 2 to clamp the wafer and an RF generator for generating plasma are provided to the electrostatic chuck 10.

(b) Subsequently, the molded body is sintered in a nitrogen atmosphere to make the electrostatic chuck body 2 with the inner electrode buried therein. A terminal which is electrically connected to the inner electrode is formed thereon. The pores 2a1, 2a2, and 2a3 which extend from the wafer mounting surface to the abutting surface on the cooling device are provided by a laser processing method or an etching processing method. A plurality of pores may be provided in the electrostatic chuck body 2 in the same manner as the pores 2a1, 2a2, and 2a3, which is not illustrated.

(c) The cooling device 1 is then made. A through-hole as the supply port 1a of the back side gas is provided in the cooling device 1. The arrangement interval and diameter of the supply port 1a is not particularly limited. When the diameter of the cooling device 1 is 300 mm, the twenty-three (23) through-holes 1a having a diameter of 1 mm are preferably provided at substantially equally spaced intervals on the circumference at a distance of 17 mm inwardly from the outer circumferential edge. The main counter bore portion 1b is provided on the side of the surface joined to the electrostatic chuck body 2 of the opening of the gas supply port so as to receive the arc prevention member 3 therein. When the diameter of the gas supply port 1a is 1 mm, the counter bore portion preferably has a diameter of 2.5 mm and a depth of 1.3 mm.

Figure 1B:
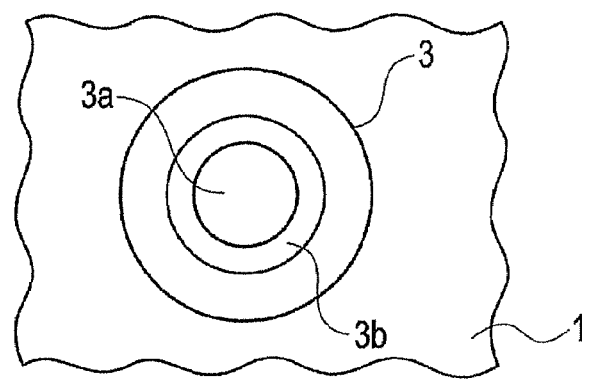
FIG. 1B is a diagram of a cooling device at the interface between an electrostatic chuck body and the cooling device of the electrostatic chuck according to the embodiment, seen from above.
Figure 1C:
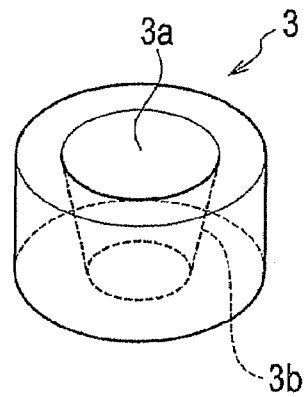
FIG. 1C is a perspective view of an arc prevention member.

(d) The arc prevention member 3, as illustrated in FIGS. 1A to 1C, is then made. The arc prevention member 3 is inserted into the main counter bore portion 1b of the cooling device 1.

(e) The electrostatic chuck body 2 and the cooling device 1 are joined at their interface via the sheet material or adhesive.

The electrostatic chuck 10 is thus manufactured.

Modifications of the Embodiment

An embodiment of the present invention is described above. It should be understood that the description and drawings as part of this disclosure do not limit this invention. Various substitute embodiments, examples, and operative techniques will become apparent to those skilled in the art from this disclosure. Modifications of the embodiment will be described below. The modifications will be described by focusing on the arc prevention member.

(Modification 1)

Figure 2A:
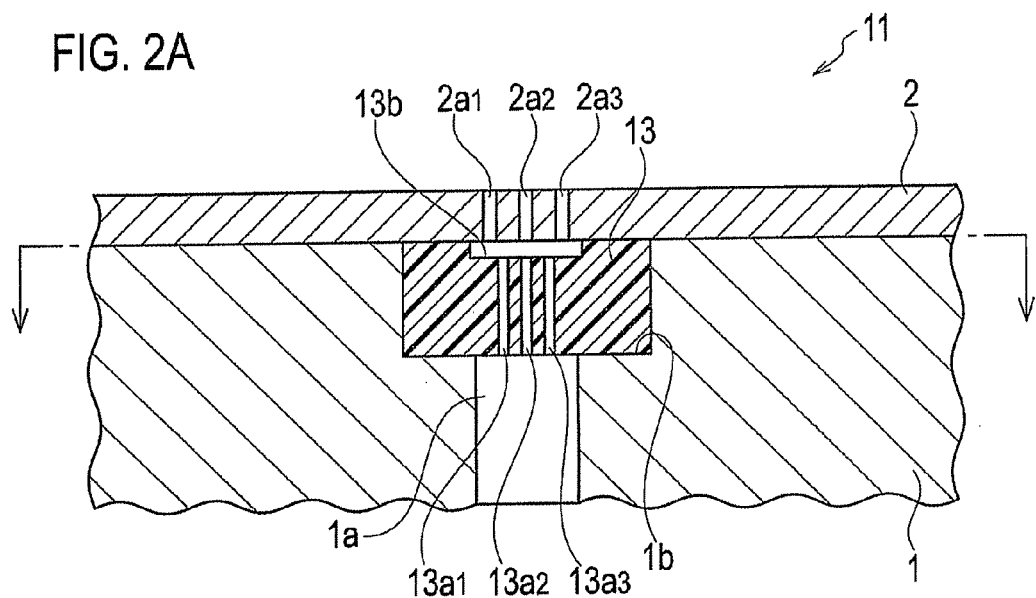
FIG. 2A is a cross section of an electrostatic chuck according to Modification 1 of the embodiment.
Figure 2B:
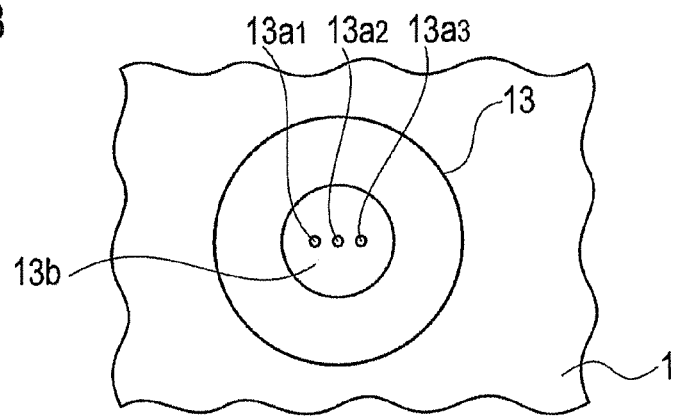
FIG. 2B is a top view of a diagram of the cooling device at the interface between the electrostatic chuck body and the cooling device of the electrostatic chuck according to Modification 1 of the embodiment.
Figure 2C:
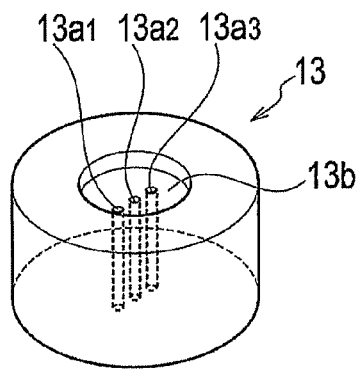
FIG. 2C is a perspective view of an arc prevention member.

In an arc prevention member 13 illustrated in FIGS. 2A to 2C, a sub-counter bore portion 13b having a diameter smaller than the outer diameter of the arc prevention member 13 is provided to the electrostatic chuck body 2-side main plane. An insulating member having a plurality of through-holes 13a1, 13a2, and 13a3 is provided from the bottom surface of the sub-counter bore portion 13b to the cooling device 1-side main plane and has a diameter smaller than the inner diameter of the gas supply port 1a. It is preferable that the plurality of through-holes and the pores of the electrostatic chuck body 2 be arranged so as not to overlapped with each other as seen from a vertically upward direction of the electrostatic chuck. Three through-holes are shown in the drawing, but there may be more.

According to Modification 1, it is difficult to generate plasma in the gas supply port 1a due to the reduced space through which the back side gas flows. Although the reason is not certain, it is considered that the joint region (interface) of the electrostatic chuck body 2 and the cooling device 1 is sealed by the arc prevention member 3 so that the creeping distance from the pores 2a1, 2a2, and 2a3 of the electrostatic chuck body 2 to the cooling device 1 is increased (Modification 2)

Figure 3A:
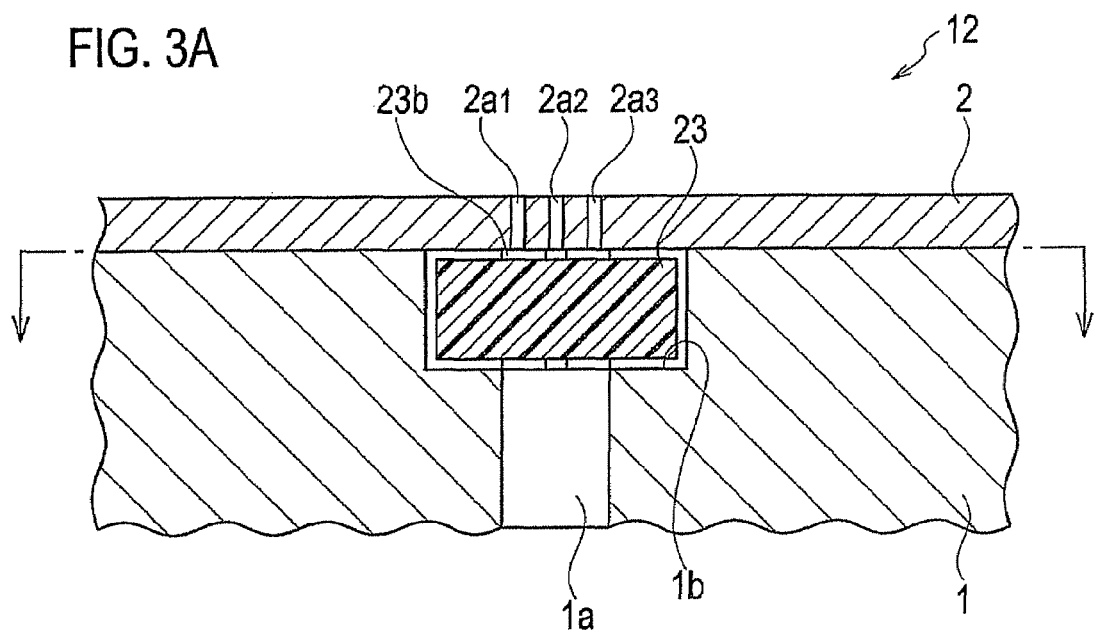
FIG. 3A is a cross section of an electrostatic chuck according to Modification 2 of the embodiment.
Figure 3B:
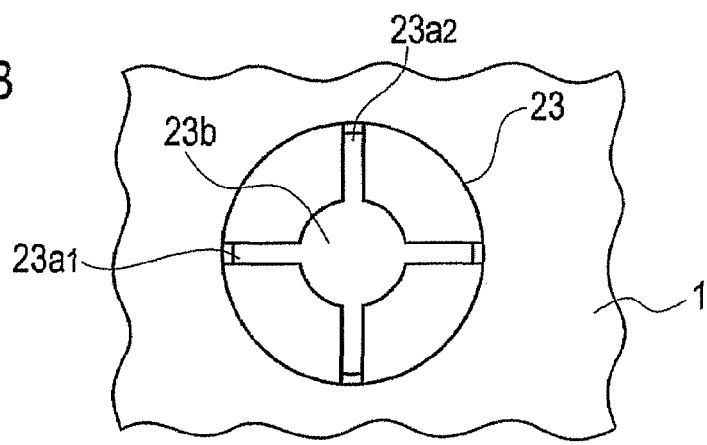
FIG. 3B is a top view of a diagram of the cooling device at the interface between the electrostatic chuck body and the cooling device of the electrostatic chuck according to Modification 2 of the embodiment.
Figure 3C:
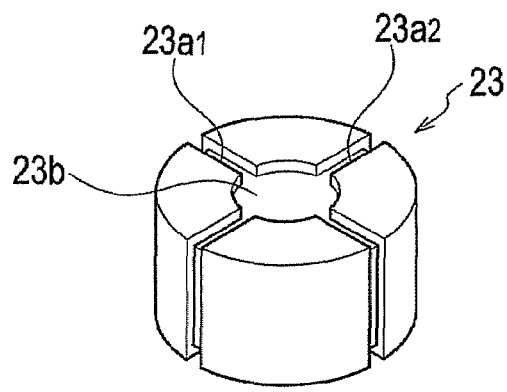
FIG. 3C is a perspective view of an arc prevention member.
Figure 4A:
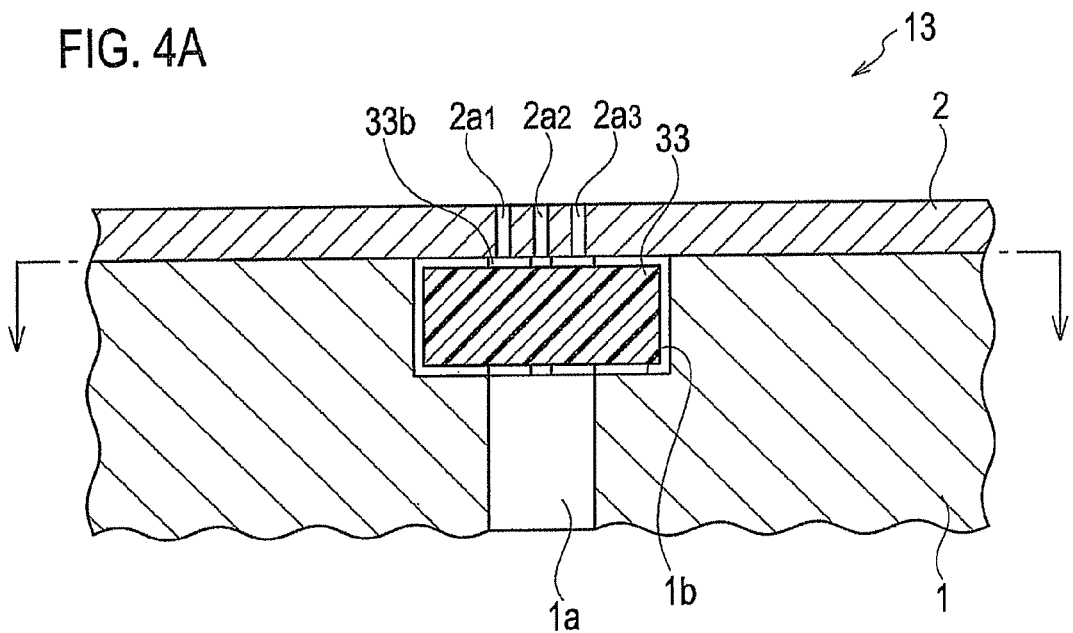
FIG. 4A is a cross section of an electrostatic chuck according to Modification 2 of the embodiment.
Figure 4B:
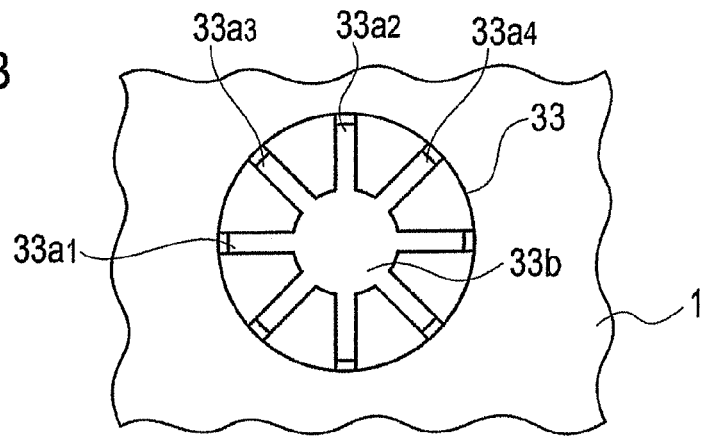
FIG. 4B is a top view of a diagram of the cooling device at the interface between the electrostatic chuck body and the cooling device of the electrostatic chuck according to Modification 2 of the embodiment.
Figure 4C:
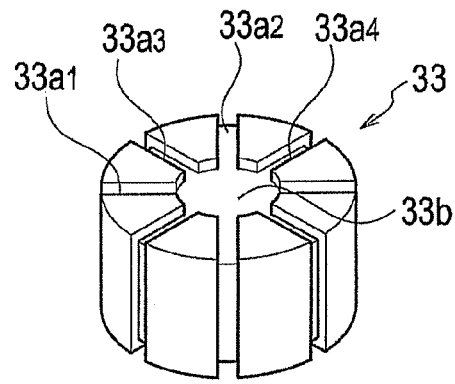
FIG. 4C is a perspective view of an arc prevention member.

In an arc prevention member 23 illustrated in FIGS. 3A to 3C, a sub-counter bore portion 23b having a diameter smaller than the outer diameter of the arc prevention member 23 is provided to the electrostatic chuck body 2-side main plane. A plurality of grooves 23a1 and 23a2 are provided in the surface of the arc prevention member and defined around a centerline in a cross-sectional view in a gas flow direction of the arc prevention member 23 so as to provide gas paths when the arc prevention member 23 is inserted into the main counter bore portion 1b. In an arc prevention member 33 illustrated in FIGS. 4A to 4C, grooves 33a1, 33a2, 33a3, and 33a4 are provided, as illustrated in FIGS. 4B and 4C, by increasing the number of grooves 23a1 and 23a2 of FIGS. 3B and 3C.

According to Modification 2, arcing can be prevented for the same reason as that of Modification 1.

(Modification 3)

Figure 5A:
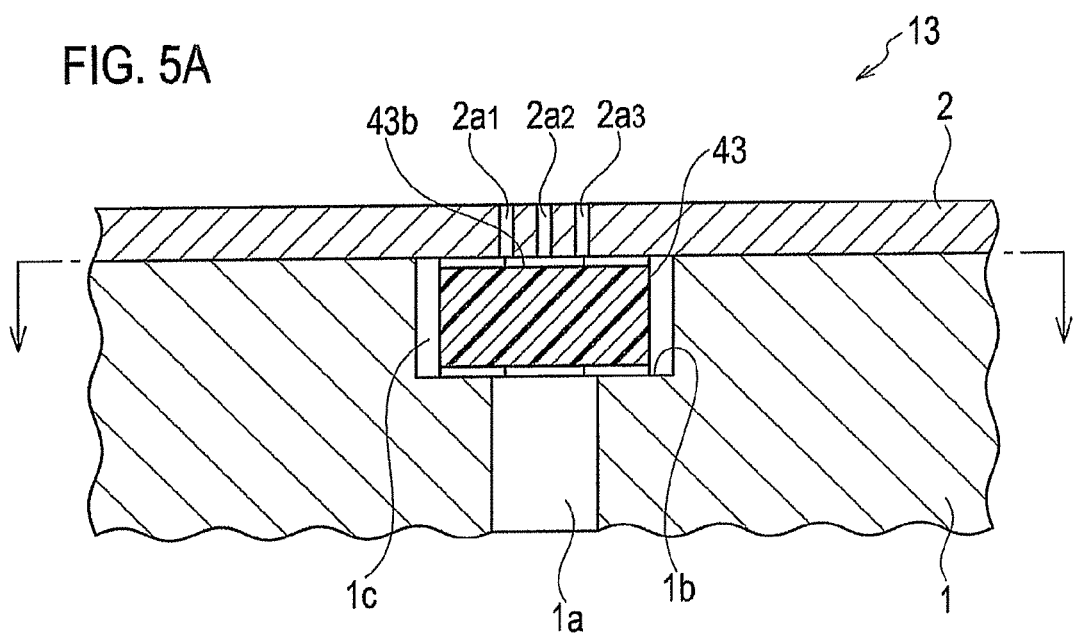
FIG. 5A is a cross section of an electrostatic chuck according to Modification 3 of the embodiment.
Figure 5B:
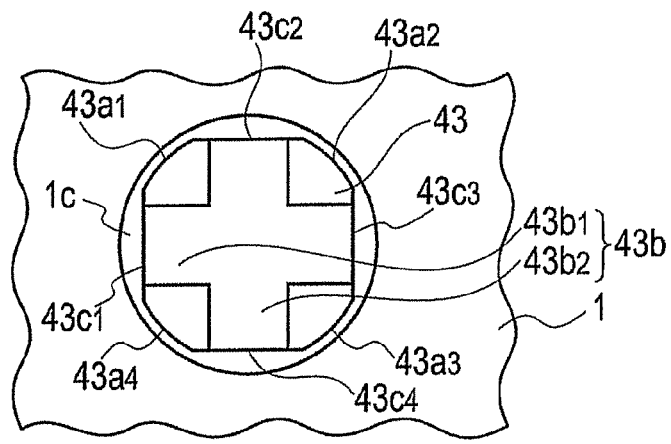
FIG. 5B is a top view of a diagram of the cooling device at the interface between the electrostatic chuck body and the cooling device of the electrostatic chuck according to Modification 3 of the embodiment.
Figure 5C:
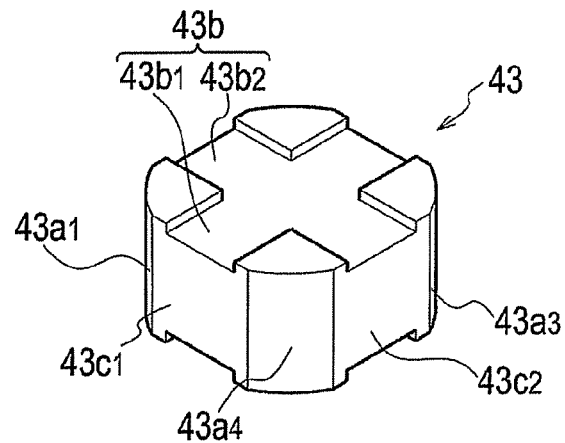
FIG. 5C is a perspective view of an arc prevention member.

FIGS. 5A to 5C show an arc prevention member 43. As shown in FIG. 5C, the arc prevention member 43 is provided with a cross-shaped sub-counter bore portion 43b formed of two grooves 43b1 and 43b2 intersecting at a central portion in a radial direction of the arc prevention member 43 on a main plane of the arc prevention member 43 on the electrostatic chuck body 2 side. As shown in FIG. 5A, this has a plurality of planar cutouts $43c_1$, $43c2$, $43c3$ and $43c4$, which run straight in a longitudinal direction of grooves $43b1$ and $43b2$ of the cross-shaped sub-counter bore portion $43b$, on the cylindrical side surface $43a$ ($43a1$, $43a2$, $43a3$ and $43a4$) as shown in FIG. 5B so as to form a gas path $1c$ when the arc prevention member 43 is inserted into the main counter bore portion $1b$. It is preferable that the diameter of the arc prevention member 43 is smaller than that of the main counter bore portion $1b$ as shown in FIG. 5B. This is because, since the back side gas flows through a narrow space between the cutouts $43a1$, $43a2$, $43a3$ and $43a4$ and an inner wall of the main counter bore portion $1b$, it is difficult to generate plasma in the gas supply port $1a$, so that the occurrence of arcing may be effectively prevented. Meanwhile, as long as the space through which the backside gas flows is formed between the cutouts $43c1$, $43c2$, $43c3$ and $43c4$ and the inner wall of the main counter bore portion $1b$, the diameter of the arc prevention member 43 may be made substantially identical to that of the main counter bore portion $1b$, however, it is preferable that this is made smaller than the diameter of the main counter bore portion $1b$ for effectively preventing the occurrence of arcing.

Although the arc prevention member 43 in FIG. 5 is easier in manufacturing than the arc prevention member 3 according to the embodiment and the arc prevention member 13, 23 and 33 according to the modification thereof, this has the arcing preventing effect similar to that of the arc prevention member 3 and the arc prevention member s 13, 23 and 33 according to the modification. This is advantageous when the arc prevention member is required to be fabricated by using unworkable hard material.

Of course, the present invention includes various embodiments which are not described here. The technical range of the present invention is determined only by an invention specific matter according to the scope of the claims.

According to the present invention, an electrostatic chuck which can prevent arcing with increased plasma density is provided.

EXAMPLES

Manufacture of the Electrostatic Chuck

Manufacturing Example 1

The electrostatic chuck according to Manufacturing example 1 is manufactured under the following conditions.

(a) The electrostatic chuck body 2 is made of alumina and has a diameter of 300 mm and a thickness of about 1.1 mm, with a bipolar electrode buried therein. The pores $2a1$, $2a2$, and $2a3$ having a diameter of about 1 mm are provided by irradiating the electrostatic chuck body 2 with a $CO_2$ laser (a wavelength of 10.6 μm) from the cooling device 1 side. Four pores are provided other than the illustrated pores $2a1$, $2a2$, and $2a3$.

(b) The diameter of the cooling device 1 is 300 mm and the thickness of the cooling device 1 is about 34 mm. Twenty-three through-holes having a diameter of about 1 mm are provided on the circumference at a distance of about 17 mm from the outer circumference of the cooling device 1, which is made of aluminum.

(c) The main counter bore portion $1b$ which has a diameter of about 2.5 mm and a depth of about 1.3 mm and receives the arc prevention member 3 therein is provided on the side of the surface connected to the electrostatic chuck body 2 of the through-hole by end milling.

(d) The arc prevention member 3 is shaped as illustrated in FIGS. 1A to 1C and is made of polytetrafluoroethylene. Teflon® is used as polytetrafluoroethylene in this embodiment.

(e) After the arc prevention member 3 is inserted into the main counter bore portion $1b$ of the cooling device 17 the cooling device 1 and the electrostatic chuck body 2 are connected via the sheet material of acrylic to complete the assembly of the electrostatic chuck 10.

Manufacturing Examples 2, 3, and 4

Instead of the arc prevention member 3, the electrostatic chucks 11, 12, and 13 are manufactured as in Manufacturing example 1, except that the arc prevention members 13, 23, and 33 as shown in FIGS. 2A to 2C, FIGS. 3A to 3C, and FIGS. 4A to 4C are made of polytetrafluoroethylene.

Manufacturing Examples 5, 6, 7, and 8

Instead of the arc prevention member 3, the electrostatic chuck 10 is manufactured as in Manufacturing example 1, except that the arc prevention members 13, 23, and 33 as shown in FIGS. 1A to 1C, FIGS. 2A to 2C, FIGS. 3A to 3C, and FIGS. 4A to 4C are made of 99% alumina.

A Manufacturing Comparative Example

Figure 6A:
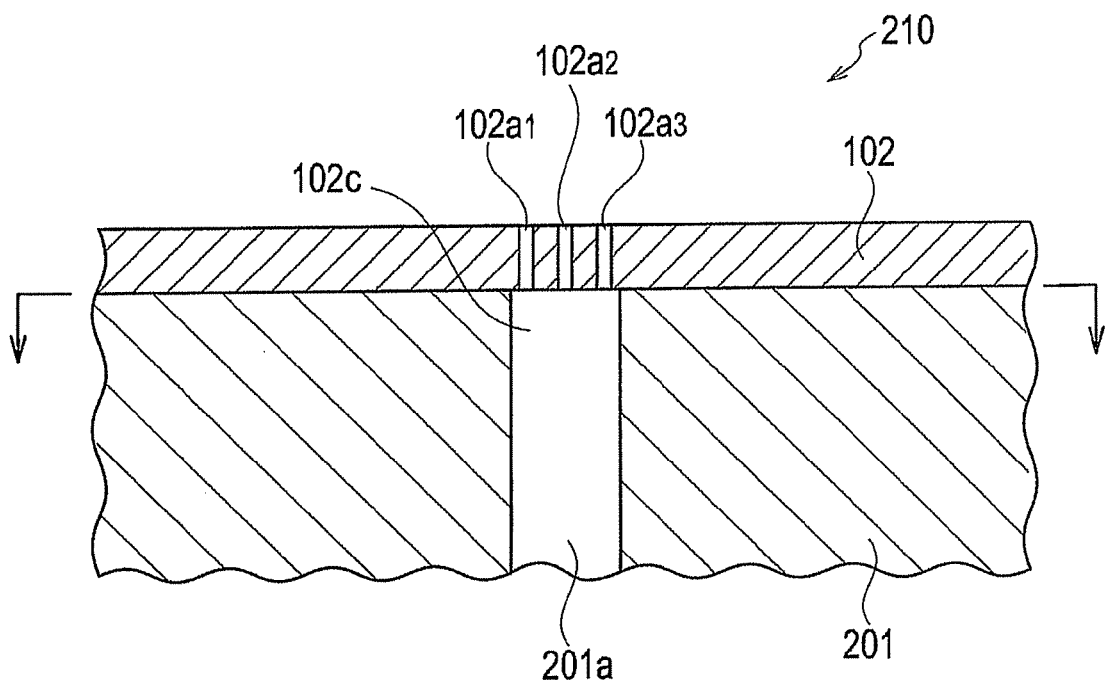
FIG. 6A is a cross section of an electrostatic chuck according to a comparative example.
Figure 6B:
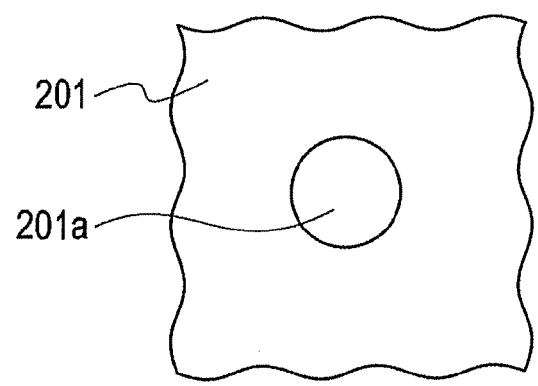
FIG. 6B is a top view of a diagram of a cooling device at the interface between an electrostatic chuck body and the cooling device of the electrostatic chuck according to the comparative example.

An electrostatic chuck 210 according to a manufacturing comparative example is manufactured by the method according to the above embodiment, except that the arc prevention member is not used and the shape of the cooling device 1 is as illustrated in FIGS. 6A and 6I.

Evaluation of Arc Preventing Effects

Examples 1 to 4 and Comparative Examples

The arc preventing effects of the electrostatic chucks illustrated in FIGS. 1A to 4c, FIGS. 6A,6B and manufactured by Manufacturing examples 1 to 4 and the manufacturing comparative example are evaluated under the conditions shown in Table 1.

Each of the electrostatic chucks illustrated in FIGS. 1A to 5B was installed in a vacuum chamber for evaluation. A wafer made of silicon was mounted on the electrostatic chuck 10. DC voltage was applied to the electrostatic electrode of the electrostatic chuck to clamp the wafer thereto. The clamping voltage was +V250/−V250.

The inside of the chamber and the gas supply line were evacuated to 0.1 Torr (13.3 Pa). A gas mixture of argon (Ar) and helium (He) was supplied into the chamber so that the pressure in the chamber was 1 Torr (133 Pa). The (He) gas pressure is controlled from outside of the chamber and was supplied to the gas supply port $1a$ of the electrostatic chuck and becomes the back side gas of the wafer. As shown in Table 1, the pressure of the back side gas (He) was 10 Torr (1330

Pa). Here, the term "back side gas" is defined as a gas which flows between the wafer and the surface of the electrostatic chuck when the wafer is fixed to the work mounting surface of the electrostatic chuck A radiofrequency voltage of 13.56 MHz was applied between upper and lower parallel plate electrodes (that is, the upper electrode plate provided in the chamber and the cooling device 1). Plasma was generated in the space between the electrostatic chuck 10 and the upper electrode plate (that is, on the wafer). The application was stopped after an elapsed time of one minute and the electrostatic chuck 10 was left standing for 30 seconds, after which plasma was again generated for one minute. The cycle was repeated 10 times.

An electrostatic voltage was grounded to 0 V and the wafer was then unclamped. The presence or absence of arcing was visually checked. The electrostatic chuck which created an arc trace on the wafer back side was evaluated and denoted as "Present". The electrostatic chuck which did not have an arc trace on the wafer back side was evaluated and denoted as "absent". A summary of the results is shown in Table 1.

TABLE 1

|  |  | Comparative example 1 | Example 1 | Example 2 | Example 3 | Example 4 |
|---|---|---|---|---|---|---|
| Arcing preventing | Shape | FIG. 6 | FIG. 1 | FIG. 2 | FIG. 3 | FIG. 4 |
|  | Material |  | Polytetrafluoroethylene |  |  |  |
| Plasma output (W) | 300 | Absent | Absent | Absent | Absent | Absent |
|  | 500 | Present | Absent | Absent | Absent | Absent |
|  | 800 | Present | Absent | Absent | Absent | Absent |
|  | 1000 | Present | Absent | Absent | Absent | Absent |
|  | 1500 | Present | Absent | Absent | Absent | Absent |
|  | 2000 | Present | Present | Absent | Absent | Absent |
|  | 3000 | Present | Present | Absent | Absent | Absent |
|  | 4000 | Present | Present | Absent | Present | Present |

Back side gas (He) pressure 10 Torr (1330 Pa)

Examples 5 to 8 and Comparative Example 2

TABLE 2

|  |  | Comparative example 2 | Example 5 | Example 6 | Example 7 | Example 8 |
|---|---|---|---|---|---|---|
| Arcing prevent | Shape | FIG. 6 | FIG. 1 | FIG. 2 | FIG. 3 | FIG. 4 |
|  | Material |  | Polytetrafluoroethylene |  |  |  |
| Plasma output (W) | 300 | Present | Absent | Absent | Absent | Absent |
|  | 500 | Present | Absent | Absent | Absent | Absent |
|  | 800 | Present | Absent | Absent | Absent | Absent |
|  | 1000 | Present | Absent | Absent | Absent | Absent |
|  | 1500 | Present | Present | Absent | Absent | Absent |
|  | 2000 | Present | Present | Absent | Absent | Absent |
|  | 3000 | Present | Present | Absent | Present | Present |
|  | 4000 | Present | Present | Present | Present | Present |

Back side gas (He) pressure 1 Torr (133 Pa)

As shown in Table 2, the arc preventing effects are evaluated as in Example 1, except that the back side gas pressure is 1 Torr (133 Pa). A summary of the results is shown in Table 2.

Examples 9 to 13 and Comparative Example 3

As shown in Table 3, the arc preventing effects are evaluated as in Example 1 except that the material of the arc prevention member is 99% alumina. In addition, gas flow quantity was measured in accordance with the following a measurement method. A summary of the obtained results is shown in Table 3.

(A Measurement Method of Gas Flow Quantity)

A mass flow meter was installed in the middle of pipe laying to lead to an origin of gas supply and a gas supply bore of the electrostatic chuck. And a chamber was turned into a vacuum (about 0 Torr (Pa)), and gas flow quantity through the electrostatic chuck which a wafer was not mounted on was measured by a mass flow meter. Here, when the back side pressure is 10 Torr (1330 Pa) in the table, gas supply original pressure is 10 Torr (1330 Pa).

When a wafer is fixed to the work mounting surface of the electrostatic chuck thus the wafer is adsorbed by the electrostatic chuck, the back side pressure is equal to the gas supply original pressure. When a wafer is not fixed to the work mounting surface of the electrostatic chuck thus the wafer is not adsorbed by the electrostatic chucks gas is released into the vacuum (0 Torr (Pa)), so that there is no back side pressure. Here, "SCCM" in table 3 is an abbreviation of standard cc(cm$^3$)/min, and the SCCM shows flow quantity per unit time in fixed temperature (25° C.) under a 1 atm (atmospheric pressure 1,013 hPa).

TABLE 3

|  |  | Comparative example 3 | Example 9 | Example 10 | Example 11 | Example 12 | Example 13 |
|---|---|---|---|---|---|---|---|
| Arcing preventing | Shape | FIG. 6 | FIG. 1 | FIG. 2 | FIG. 3 | FIG. 4 | FIG. 5 |
|  | Material |  |  | 99% Alumina |  |  |  |
| Plasma output (W) | 300 | Absent | Absent | Absent | Absent | Absent | Absent |
|  | 500 | Present | Absent | Absent | Absent | Absent | Absent |
|  | 800 | Present | Absent | Absent | Absent | Absent | Absent |
|  | 1000 | Present | Absent | Absent | Absent | Absent | Absent |
|  | 1500 | Present | Absent | Absent | Absent | Absent | Absent |
|  | 2000 | Present | Present | Absent | Absent | Absent | Absent |
|  | 3000 | Present | Present | Absent | Absent | Absent | Absent |
|  | 4000 | Present | Present | Absent | Present | Present | Absent |
| standard cc (cm$^3$)-min (SCCM) |  | 18 | 18 | 12 | 14 | 15 | 18 |

Back side gas (He) pressure 10 Torr(1330 Pa)

As shown in Table 3, it was found that no arcing is created in the electrostatic chucks provided with the arc prevention members according to the examples maintaining the gas flow quantity in good. In particular in examples 9 and 13, it was founded that no arcing is created while maintaining gas flow quantity in good as same as a comparative example.

Examples 14 to 18 and Comparative Example 4

As shown in Table 4, the arc preventing effects are evaluated as in Example 1, except that 99% alumina is used as the material of the arc prevention member and the back side gas pressure is 1 Torr (133 Pa). A summary of the obtained results is shown in Table 4.

TABLE 4

|  |  | Comparative example 4 | Example 14 | Example 15 | Example 16 | Example 17 | Example 18 |
|---|---|---|---|---|---|---|---|
| Arcing preventing | Shape | FIG. 6 | FIG. 1 | FIG. 2 | FIG. 3 | FIG. 4 | FIG. 5 |
|  | Material |  |  | 99% Alumina |  |  |  |
| Plasma output (W) | 300 | Present | Absent | Absent | Absent | Absent | Absent |
|  | 500 | Present | Absent | Absent | Absent | Absent | Absent |
|  | 800 | Present | Absent | Absent | Absent | Absent | Absent |
|  | 1000 | Present | Absent | Absent | Absent | Absent | Absent |
|  | 1500 | Present | Present | Absent | Absent | Absent | Absent |
|  | 2000 | Present | Present | Absent | Absent | Absent | Absent |
|  | 3000 | Present | Present | Absent | Present | Present | Absent |
|  | 4000 | Present | Present | Present | Present | Present | Present |

Back side gas (He)
pressure 10 Torr (1330 Pa)

As shown in Tables 1 to 4, it was found that no arcing is created in the electrostatic chucks provided with the arc prevention members according to the examples until the plasma output is higher than that of the comparative examples. It was also found that the arc prevention member 13 as shown in FIGS. 2(A), 2(B), and 2(C) was the least likely to create arcing.

By comparison of Table 1 with Table 2, it was found that arcing is likely to be caused by the lower plasma output when the output of the back side (He) gas is low. The same is true for comparison of Table 3 with Table 4. Even when the back side gas pressure is low, it can be seen that electrostatic chucks including an arc prevention members according to Examples 1 to 16 function effectively.

After one occurrence of arcing, the plasma voltage is applied to the same electrostatic chuck. When the arc prevention member of polytetrafluoroethylene is used, arcing is likely to occur due to the lower plasma output. When an alumina arc prevention is used, arcing occurs at the same plasma output. It is thought that this difference occurs due to the heat resistance of the arc prevention member. The arc prevention member of polytetrafluoroethylene changes its shape due to arcing. The alumina arc prevention member hardly changes its shape. Refractory insulating ceramics, such as alumina, is more preferable as a material for the arc prevention member.

What is claimed is:

1. An electrostatic chuck comprising:
    a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port;
    an arc prevention member buried in the main counter bore portion and made of an insulating member, wherein the arc prevention member has a gas path which is a tapered inner wall having an inner diameter extending concentrically in a direction from the cooling device towards the electrostatic chuck body, and wherein the gas path is configured to communicate with the gas supply port; and
    an electrostatic chuck body arranged on the cooling device, defining a work mounting surface on a top surface of the electrostatic chuck body, provided with a pore in communication with the gas supply port via the gas path.

2. The electrostatic chuck of claim 1, wherein the diameter of the arc prevention member is at least two and less than four times the thickness of the electrostatic chuck body.

3. The electrostatic chuck of claim 1, wherein the arc prevention member is alumina or aluminum nitride.

4. An electrostatic chuck comprising:
    a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port;
    an arc prevention member buried in the main counter bore portion and made of an insulating member, wherein the arc prevention member has a sub-counter bore portion having a diameter smaller than the outer diameter of the arc prevention member on the electrostatic chuck body side, and a plurality of gas paths extending from the bottom surface of the sub-counter bore portion toward the main plane of the cooling device, and the gas paths having a diameter smaller than the inner diameter of the gas supply port, and wherein the gas paths are configured to communicate with the gas supply port; and
    an electrostatic chuck body arranged on the cooling device, defining a work mounting surface on a top surface of the electrostatic chuck body, provided with a pore in communication with the gas supply port via the gas paths.

5. An electrostatic chuck comprising:
    a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port;
    an arc prevention member buried in the main counter bore portion, wherein a plurality of grooves are provided in the surface of the arc prevention member defined around a centerline in a cross-sectional view in a gas flow direction of the arc prevention member so as to define gas paths, the gas paths are configured to communicate with the gas supply port when the arc prevention member is inserted into the main counter bore portion; and an electrostatic chuck body arranged on the cooling device, defining a work mounting surface on a top surface of the electrostatic chuck body, provided with pore(s) in communication with the gas supply port via the gas paths.

6. The electrostatic chuck of claim 5, wherein the diameter of the arc prevention member is at least two and less than four times the thickness of the electrostatic chuck body.

7. The electrostatic chuck of claim 5, wherein the arc prevention member is alumina or aluminum nitride.

8. An electrostatic chuck comprising:

a cooling device serving as an RF electrode, including a gas supply port penetrating through the cooling device, the gas supply port extending from one main surface to the other main surface, and a main counter bore portion having a diameter larger than that of the gas supply port, the main counter bore portion provided in an opening of the gas supply port;

an arc prevention member buried in the main counter bore portion, wherein the arc prevention member comprising a cross-shaped sub-counter bore portion formed of two grooves intersecting at a central portion in a radial direction of the arc prevention member on a main plane of the arc prevention member on an electrostatic chuck body side, and having a plurality of planar cutouts, which run straight in a longitudinal direction of each of the grooves of the cross-shaped sub-counter bore portion, on a cylindrical side surface so as to form a gas path when inserted into the main counter bore portion; and an electrostatic chuck body arranged on the cooling device, defining a work mounting surface on a top surface of the electrostatic chuck body, provided with pore(s) in communication with the gas supply port via the gas paths.

9. The electrostatic chuck of claim 8, wherein a diameter of the arc prevention member is smaller than a diameter of the main counter bore portion.

10. The electrostatic chuck of claim 8, wherein the diameter of the arc prevention member is at least two and less than four times the thickness of the electrostatic chuck body.

11. The electrostatic chuck of claim 8, wherein the arc prevention member is alumina or aluminum nitride.

* * * * *

UNITED STATES PATENT AND TRADEMARK OFFICE
CERTIFICATE OF CORRECTION

PATENT NO. : 8,336,891 B2  Page 1 of 1
APPLICATION NO. : 12/400830
DATED : December 25, 2012
INVENTOR(S) : Yoshinobu Goto It is certified that error appears in the above-identified patent and that said Letters Patent is hereby corrected as shown below:

Please add the following to the Cover Page of the Patent:

(30) Foreign Application Priority Data

March 5, 2009 (JP) 2009-052670

Signed and Sealed this
Nineteenth Day of March, 2013

Teresa Stanek Rea
*Acting Director of the United States Patent and Trademark Office*